United States Patent
Park et al.

(10) Patent No.: US 8,653,909 B2
(45) Date of Patent: Feb. 18, 2014

(54) APPARATUS FOR WIRELESS POWER TRANSMISSION USING HIGH Q LOW FREQUENCY NEAR MAGNETIC FIELD RESONATOR

(75) Inventors: Eun-seok Park, Suwon-si (KR);
Sang-wook Kwon, Seongnam-si (KR);
Jea-shik Shin, Hwaseong-si (KR);
Young-tack Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 502 days.

(21) Appl. No.: 12/591,357

(22) Filed: Nov. 17, 2009

(65) Prior Publication Data

US 2010/0123530 A1    May 20, 2010

(30) Foreign Application Priority Data

Nov. 17, 2008 (KR) .......................... 10-2008-0113986

(51) Int. Cl.
*H01P 7/00*    (2006.01)
*H03H 7/00*    (2006.01)

(52) U.S. Cl.
USPC .......................................... 333/219; 333/172

(58) Field of Classification Search
USPC ................. 333/204, 205, 219, 172; 455/41.1; 307/104
See application file for complete search history.

(56) References Cited

U.S. PATENT DOCUMENTS

| | | | |
|---|---|---|---|
| 3,760,302 A * | 9/1973 | Cohn | 333/204 |
| 7,026,893 B2 | 4/2006 | Kim et al. | |
| 7,391,288 B1 | 6/2008 | Itoh et al. | |
| 7,855,696 B2 * | 12/2010 | Gummalla et al. | 343/876 |
| 7,911,386 B1 * | 3/2011 | Itoh et al. | 343/700 MS |
| 2004/0140945 A1 * | 7/2004 | Werner et al. | 343/909 |
| 2006/0066422 A1 | 3/2006 | Itoh et al. | |
| 2008/0001684 A1 | 1/2008 | Itoh et al. | |
| 2008/0278264 A1 * | 11/2008 | Karalis et al. | 333/219 |
| 2009/0033586 A1 * | 2/2009 | Sanada | 343/911 R |

FOREIGN PATENT DOCUMENTS

| | | |
|---|---|---|
| JP | 2004-140672 | 5/2004 |
| JP | 2005-198228 | 7/2005 |
| JP | 2007-043560 | 2/2007 |

OTHER PUBLICATIONS

Mosallaei, "FDTD-PLRC Technique for Modeling of Anisotropic-Dispersive Media and Metamaterial Devices", IEEE Trans. on Electromagnetic Compatibility, vol. 49, No. 3, Aug. 2007, pp. 649-660.*

* cited by examiner

*Primary Examiner* — Dean O Takaoka
*Assistant Examiner* — Alan Wong
(74) *Attorney, Agent, or Firm* — NSIP Law

(57) ABSTRACT

An apparatus for wireless power transmission is disclosed. According to an exemplary aspect, the wireless power transmission apparatus includes a high Q low frequency near magnetic field resonator having characteristics of a metamaterial. Accordingly, manufacturing of a compact power supply capable of wirelessly supplying power to mobile communication terminals or multimedia terminals is possible. By using a zeroth-order resonator with a DNG or ENG structure, a small-sized power supply with a simple configuration may be manufactured.

18 Claims, 6 Drawing Sheets

APPARATUS FOR WIRELESS POWER TRANSMISSION USING HIGH Q LOW FREQUENCY NEAR MAGNETIC FIELD RESONATOR

CROSS-REFERENCE TO RELATED APPLICATIONS

This application claims the benefit under 35 U.S.C. §119 (a) of Korean Patent Application No. 10-2008-113986, filed on Nov. 17, 2008, the disclosure of which is incorporated by reference in its entirety for all purposes.

BACKGROUND

1. Field

One or more embodiments relate to power transmission, and more particularly, to an apparatus for wireless power transmission.

2. Description of the Related Art

Following the development of mobile devices with various functions in applications such as data processing, multimedia, mobile communications, and so on, there has been found a need for a more convenient method to charge mobile terminals or supply power thereto.

Since mobile devices may use different interfaces to supply power, they may need different power supplies or chargers according to their respective specifications.

In order to overcome such an inconvenience, studies on wireless power transmission technologies allowing the wireless supply of power are currently being made. If wireless power transmission technology is put to practical use, mobile devices may be charged conveniently anywhere at any time and the number of wasted dry cells may be reduced, which will reduce the amount of waste materials and pollution.

As an example of one such wireless power transmission method, studies on wireless high power transmission over short distances using electromagnetic resonance based on evanescent wave coupling are currently being made. However, since this technology uses a near-field, low frequencies have to be used to transmit power over a short distance, which leads to an inevitable increase in the size of a resonator.

Also, in order to transmit power while minimizing the effect to humans, a resonator which exploits a magnetic field and not an electric field is needed. A loop resonator is generally used as such a near magnetic field resonator.

However, due to a need for use of low frequencies in order to efficiently transmit power over a short distance, an increase in the size of the loop resonator is not avoidable. Consequently, there are great difficulties in applying the conventional wireless power transmission technology to mobile devices or home appliances.

SUMMARY

One or more embodiments relate to an apparatus for wireless power transmission using a high Q (quality factor) low frequency near magnetic field resonator having characteristics of a metamaterial.

According to one or more embodiments, there is provided a wireless power transmission apparatus including a high Q magnetic field resonator having characteristics of a metamaterial.

The high Q magnetic field resonator has characteristics of a double-negative (DNG) metamaterial or an epsilon-negative (ENG) metamaterial. The characteristics of the DNG metamaterial are implemented by a resonance circuit which includes a series capacitor and a shunt inductor on a transmission line. The characteristics of the ENG metamaterial are implemented by a resonance circuit which includes a shunt inductor on a transmission line.

In the resonance circuit to implement the characteristics of the ENG metamaterial, a Q value is increased by forming at least one via in a substrate or the shunt inductor is formed by forming a slot in a substrate to lengthen a path of current flow. The substrate is made of a ferrite material to confine an electric field within the substrate and increase the strength of a magnetic field which extends outside of the substrate.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

Figure 1:
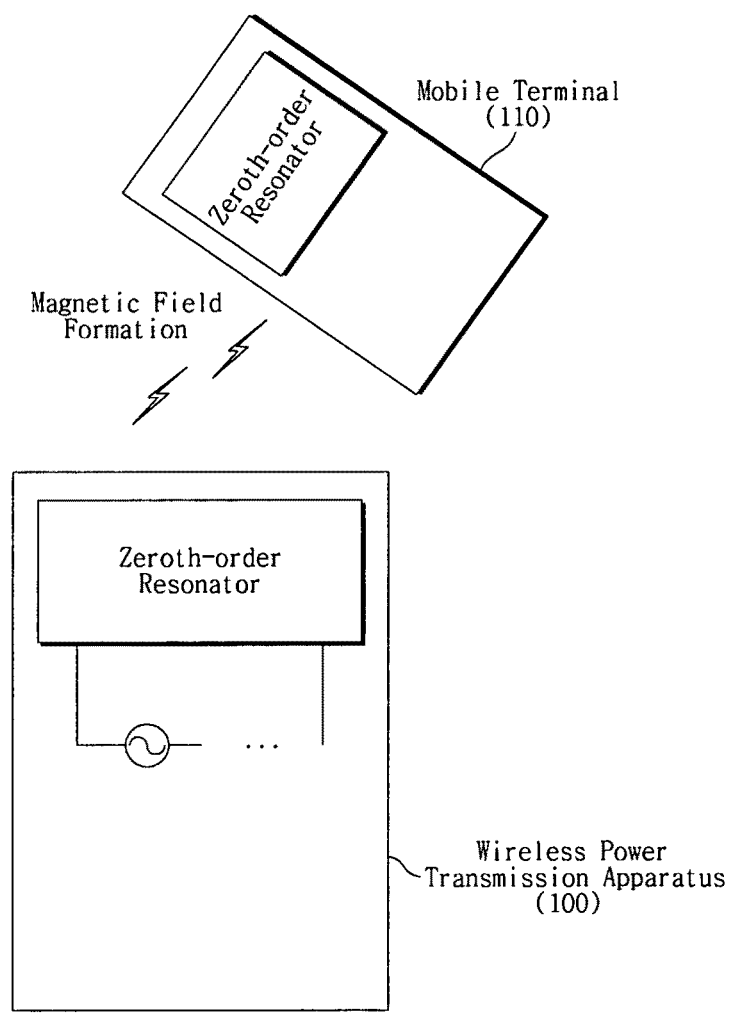
FIG. 1 is a view for explaining the concept of a wireless power transmission apparatus using resonance coupling of a zeroth-order resonator.

Reference will now be made in detail to embodiments, examples of which are illustrated in the accompanying drawings, wherein like reference numerals refer to like elements throughout. In this regard, embodiments of the present invention may be embodied in many different forms and should not be construed as being limited to embodiments set forth herein. Accordingly, embodiments are merely described below, by referring to the figures, to explain aspects of the present invention.

FIG. 1 is a view for explaining the concept of a wireless power transmission apparatus 100 using resonance coupling of a zeroth-order resonator.

The wireless power transmission apparatus 100 includes a zeroth-order resonator. In FIG. 1, a mobile terminal 110 also includes a zeroth-order resonator and receives power through a magnetic field created by resonance coupling. The received power is stored in the rechargeable battery of the mobile terminal 110.

Studies on zeroth-order resonators have been mainly made in association with applications for antennas using far-fields. However, zeroth-order resonators, are more suitable to applications using near fields as a zeroth-order resonator has a planer structure, high Q (quality factor) value and low transmission efficiency. However, as there are few appropriate applications using near-fields, studies on the application of antennas using far-fields have been actively made to date.

A zeroth-order resonator may be applied as a near-field resonator in which the effect of a magnetic field is more dominant than those of an electric field. A high Q value near magnetic field resonator according to an exemplary embodiment utilizes this property.

Wireless power transmission using resonance coupling uses a near field. The higher the Q value, the higher the energy transmission efficiency, as seen in Equation 1 below.

$$\eta(\text{transmission efficiency}) = K/\Gamma \qquad \text{Equation 1}$$

Here, K represents intensity of resonance coupling, and $\Gamma$ represents $1/Q$.

As understood by Equation 1, if a zeroth-order resonator which has a relatively high Q value and whose resonance frequency is independent from an operating frequency is used, a small-sized resonator which has high power transmission efficiency may be implemented.

Also, since the zeroth-order resonator has a field which is in the form of a magnetic dipole at a resonance frequency, the effects of a magnetic field are more dominant than those of the electrical field in a near field. Accordingly, power transmission through magnetic field coupling that is harmless to humans is possible.

Figure 2A:
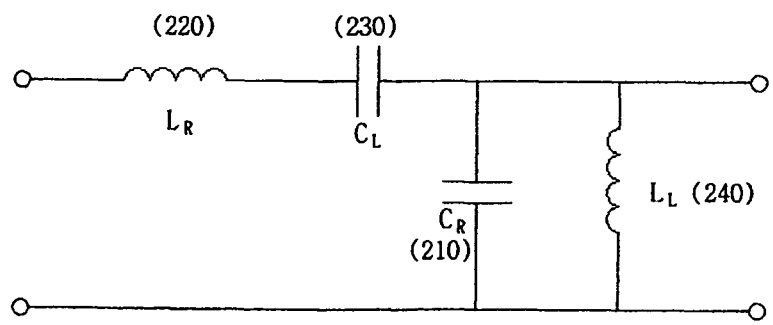
FIGS. 2A and 2B are circuit diagrams of circuits to implement characteristics of a metamaterial using a transmission line.
Figure 2B:
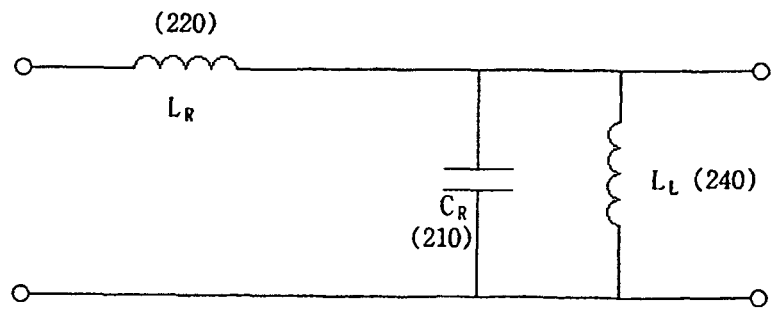

FIGS. 2A and 2B are circuit diagrams of circuits to implement characteristics of a metamaterial using a transmission line.

In more detail, FIGS. 2A and 2B show circuits that have double-negative (DNG) characteristics or epsilon-negative (ENG) characteristics using a transmission line (TL). Metamaterials are classified according to the real/imaginary nature of values regarding permittivity and magnetic permeability, into DNG whose permittivity and magnetic permeability are all imaginary values, ENG whose magnetic permeability is a positive value and whose permittivity is an imaginary value, and mu-negative (MNG) whose permittivity is a positive value and whose magnetic permeability is an imaginary value.

Referring to FIG. 2A, a shunt capacitor $C_R$ 210 and a series inductor $L_R$ 220 are devices on a right handed transmission line, and by adding a series capacitor $C_L$ 230 and a shunt inductor $L_L$ 240, a transmission line having DNG characteristics may be constructed.

Also, referring to FIG. 2B, by adding only the shunt inductor $L_L$ 240 to the shunt capacitor $C_R$ 210 and series inductor $L_R$ 220, a transmission line having ENG characteristics may be constructed.

Figure 3:
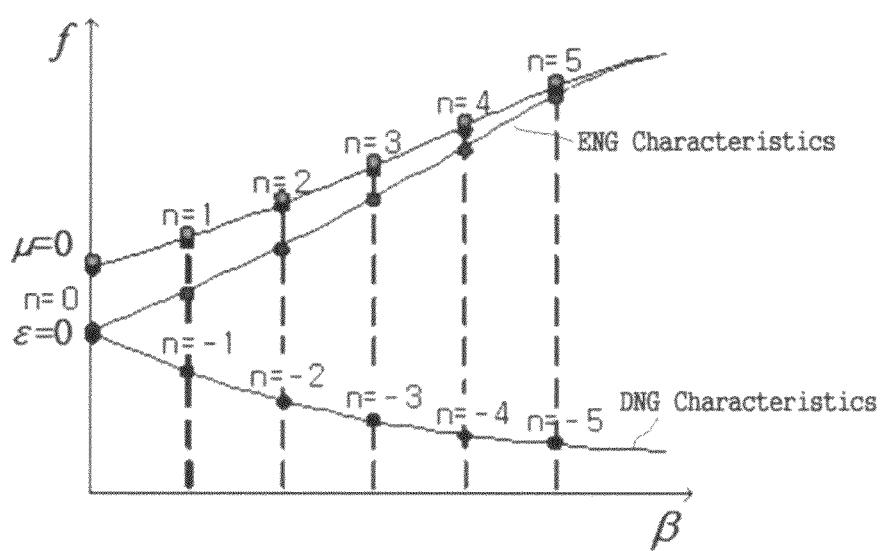
FIG. 3 is a graph showing dispersion curves of an epsilon-negative (ENG) transmission line and a double-negative (DNG) transmission line.

FIG. 3 is a graph showing dispersion curves of an ENG transmission line and a DNG transmission line.

Referring to FIG. 3, both the DNG and ENG transmission lines have a resonance mode at a zeroth-order, that is, when n=0. Also, FIG. 3 shows that an ENG transmission line resonates at a higher frequency than a DNG transmission line does when zeroth-order resonance occurs. Consequently, the structure of the ENG transmission line has the advantage of having a resonator configuration with a smaller size than that of the DNG transmission line structure.

Figure 4:
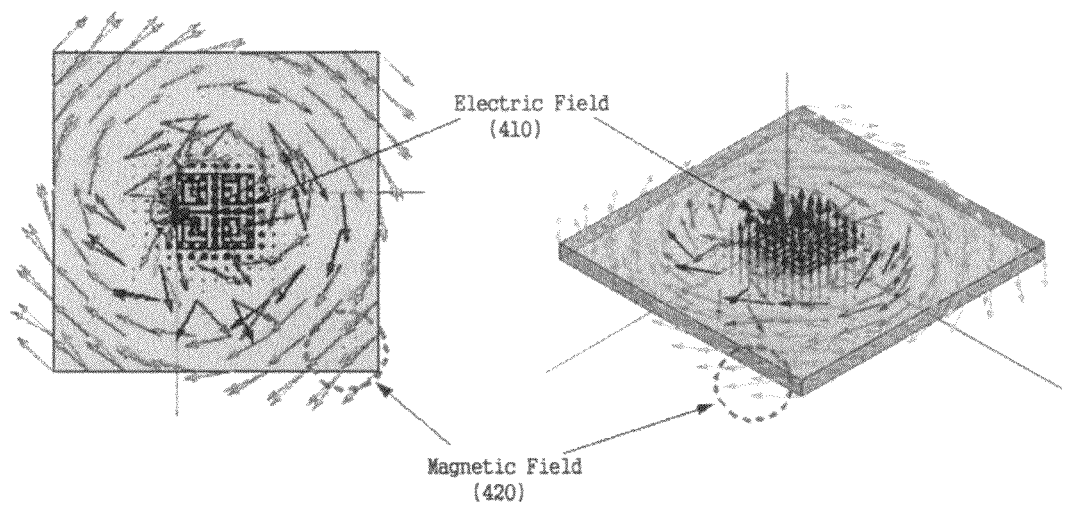
FIG. 4 illustrates the distribution of an electric field and a magnetic field in a zeroth-order resonance mode.

FIG. 4 illustrates the distribution of an electric field 410 and a magnetic field 420 in a zeroth-order resonance mode.

Referring to FIG. 4, in the zeroth-order resonance mode, the electric field 410 exists only between a substrate and a top plate, and the magnetic field 420 surrounds a resonator as if it is a magnetic dipole. Since the resonator uses a magnetic field, it is preferable that a magnetic field extends outside the substrate while an electric field that is harmful to humans is confined within the substrate, and FIG. 4 shows that the electric field 420 is confined within the substrate.

Figure 5A:
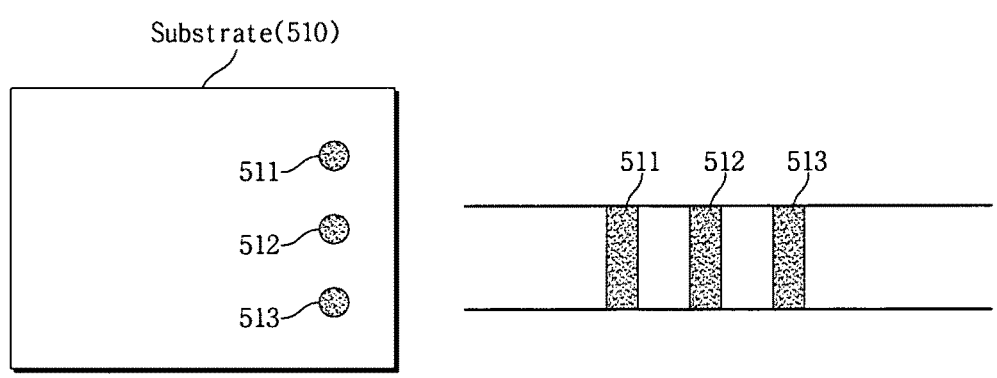
FIGS. 5A and 5B are diagrams illustrating a resonator with an ENG structure according to an exemplary embodiment.
Figure 5B:
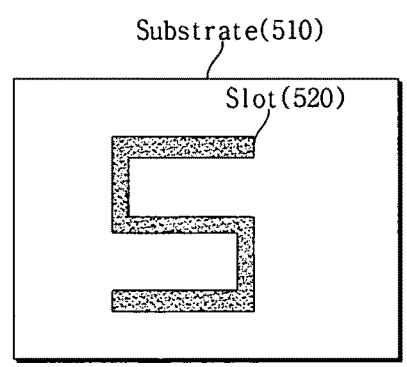

FIGS. 5A and 5B are diagrams illustrating a resonator with an ENG structure according to an exemplary embodiment.

A structure illustrated in FIG. 5A corresponds to the circuit illustrated in FIG. 2B. That is, the structure illustrated in FIG. 5A is a circuit that does not have a series capacitor which the DNG structure requires. Also, in order to configure a high Q resonator, one or more vias 511, 512, and 513 functioning as a shunt inductor L may be added. The vias 511, 512, and 513 are holes drilled on and through the substrate as throughholes thereby interconnecting top and bottom surfaces of the substrate. The Q value of a zeroth-order ENG or DNG resonator may be calculated according to Equation 2, below.

$$Q = R/(\omega_0 L_L) \qquad \text{Equation 2}$$

Here, $\omega_0$ represents a resonance frequency (Radians).

The Q value is a ratio of energy accumulated in reactive elements, such as capacitors or inductors, to a total energy loss. An ideal resonance circuit is composed of inductors and capacitors, and accumulates energy by transferring current from one element to another.

As seen in Equation 2, in order to increase the Q value, the inductance of the shunt inductor $L_L$ has to be decreased. For this, the current embodiment may use one or more vias. For example, as shown in FIG. 5A, by using three vias 511, 512, and 513, the Q value becomes three time greater than when one via is used. The number of vias is not limited.

Meanwhile, as illustrated in FIG. 5B, a slot 520 for lengthening a path of current flow may be formed in a substrate 510 so that the slot 520 functions as a shunt inductor $L_L$. In this case, the length, shape, etc., of the slot 520 may vary depending on a demanded Q value, and the shape of the substrate 510 also is not limited to the embodiment shown herein. Also, if the substrate 510 is made of a ferrite material, the electric field is more confined within the substrate 510 and the strength of the magnetic field is increased due to the characteristics of ferrite materials.

Figure 6:
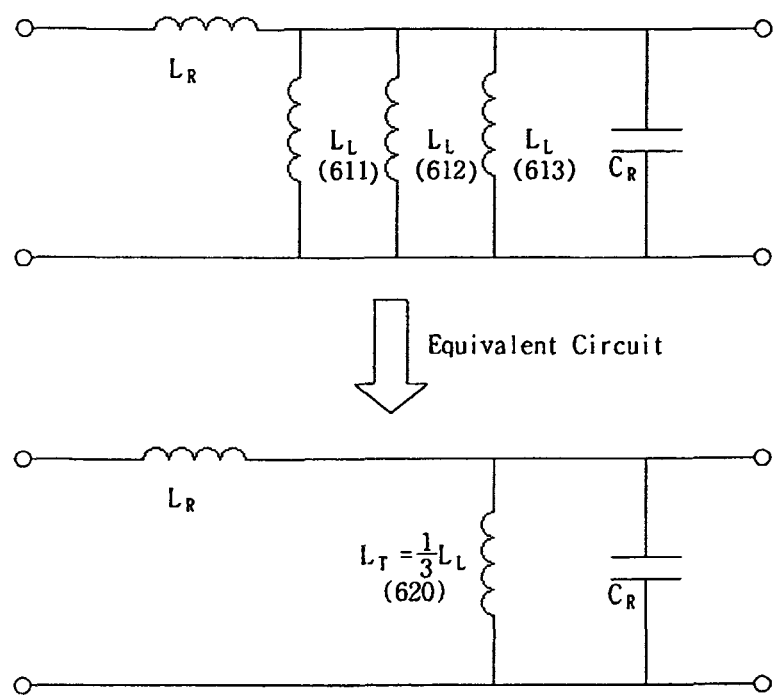
FIG. 6 is a circuit diagram illustrating a circuit of an ENG high Q (quality factor) zeroth-order resonator according to an exemplary embodiment.

FIG. 6 is a circuit diagram illustrating a circuit of an ENG high Q zeroth-order resonator according to an exemplary embodiment.

Referring to FIG. 6, parallel-connecting three shunt inductors ($L_L$) 611, 612, and 613 is a circuit of parallel-connecting an inductor ($L_T$) 620 whose inductance is equal to total inductance of the parallel-connecting three shunt inductors ($L_L$) 611, 612, and 613. Therefore, the value of $L_T$ is $\frac{1}{3} L_L$.

According to an exemplary embodiment, a small-sized power supply which can supply power wirelessly to mobile communication terminals, multimedia terminals, or the like, may be manufactured. Also, a zeroth-order resonator with a DNG or ENG structure which is used to manufacture such a small-sized power supply is compact and has a simple configuration.

In addition, since a high Q value is obtained by using one or more vias, wireless power transmission using near-field resonance coupling is possible.

Also, since a zeroth-order resonance mode is used, the effects of a magnetic field become more dominant than those of an electric field in a near-field, which minimizes harmful effects to humans when wireless power transmission occurs.

Furthermore, by adopting a metamaterial structure, a resonance frequency of the resonator is not proportional to an operating frequency, and accordingly, manufacturing of a compact low-frequency resonator which is significantly smaller than existing loop resonators is possible.

While aspects of the present invention has been particularly shown and described with reference to differing embodiments thereof, it should be understood that these exemplary embodiments should be considered in a descriptive sense only and not for purposes of limitation. Descriptions of features or aspects within each embodiment should typically be considered as available for other similar features or aspects in the remaining embodiments.

Thus, although a few embodiments have been shown and described, with additional embodiments being equally available, it would be appreciated by those skilled in the art that changes may be made in these embodiments without departing from the principles and spirit of the invention, the scope of which is defined in the claims and their equivalents.

What is claimed is:

1. A wireless power transmission apparatus, comprising:
a high Q magnetic field resonator configured to comprise a shunt inductor on a transmission line to have characteristics of a metamaterial, and configured to comprise one of a via in a substrate and a slot in the substrate as the shunt inductor to increase a quality factor (Q) value of the resonator,
wherein the metamaterial comprises an epsilon-negative (ENG) metamaterial, and
wherein, in the resonator to implement the characteristics of the ENG metamaterial, the Q value is increased by forming the via in the substrate and the shunt inductor is formed by forming the slot, which has a meandering shape, in the substrate to lengthen a path of current flow.

2. The wireless power transmission apparatus of claim 1, wherein the metamaterial comprises a double-negative (DNG) metamaterial.

3. The wireless power transmission apparatus of claim 2, wherein the characteristics of the DNG metamaterial are implemented by the resonator further comprising a series capacitor on the transmission line.

4. The wireless power transmission apparatus of claim 1, wherein the substrate is made of a ferrite material to confine an electric field within the substrate and increase the strength of a magnetic field which extends outside of the substrate.

5. The wireless power transmission apparatus of claim 1, wherein the high Q magnetic field resonator further comprises a high quality factor (Q) resonator, and is configured to calculate the Q value of the high Q resonator to comprise
$Q=R/(\omega_0 L_L)$, wherein R is a resistance, $\omega_0$ is a resonance frequency and $L_L$ is the shunt inductor.

6. A mobile device having a wireless power transmission apparatus, comprising:
a high Q magnetic field resonator configured to comprise a shunt inductor on a transmission line to have characteristics of a metamaterial, and configured to comprise one of a via in a substrate and a slot in the substrate as the shunt inductor to increase a quality factor (Q) value of the resonator.

7. A mobile device of claim 6, wherein the high Q magnetic field resonator has characteristics of a double-negative (DNG) metamaterial or an epsilon-negative (ENG) metamaterial.

8. A mobile device of claim 7, wherein the characteristics of the DNG metamaterial are implemented by the resonator further comprising a series capacitor on the transmission line.

9. A mobile device of claim 7, wherein the characteristics of the ENG metamaterial are implemented by the resonator and the shunt inductor on a transmission line is formed by forming the slot in the substrate to lengthen a path of current flow.

10. A wireless power transmission method comprising:
configuring a resonance circuit to comprise a shunt inductor on a transmission line to implement characteristics of epsilon-negative (ENG) metamaterial;
forming one of a via in a substrate and a slot in the substrate as the shunt inductor to increase a quality factor (Q) value of the resonance circuit; and
forming the shunt inductor by forming a slot, which has a meandering shape, in a substrate to lengthen a path of current flow.

11. The wireless power transmission method of claim 10, further comprising:
configuring the resonance circuit to comprise a high quality factor (Q) resonator; and
calculating the Q value of the high Q resonator to comprise $Q=R/(\omega_0 L_L)$, wherein R is a resistance, $\omega_0$ is a resonance frequency and $L_L$ is the shunt inductor.

12. The wireless power transmission method of claim 10, wherein as a number of shunt inductors increases, the Q value increases.

13. The wireless power transmission method of claim 10, wherein the resonance circuit further comprises a series inductor and a shunt capacitor.

14. A wireless power transmission method, comprising:
configuring a resonance circuit to comprise a series capacitor and a shunt inductor on a transmission line to implement characteristics of double-negative (DNG) metamaterial; and
forming one of a via in a substrate and a slot, which has a meandering shape, in the substrate as the shunt inductor to increase a quality factor (Q) value of the resonance circuit.

15. The wireless power transmission method of claim 14, further comprising:
configuring the resonance circuit to comprise a high quality factor (Q) resonator; and
calculating the Q value of the high Q resonator to comprise $Q=R/(\omega_0 L_L)$, wherein R is a resistance, $\omega_0$ is a resonance frequency and $L_L$ is the shunt inductor.

16. The wireless power transmission method of claim 14, wherein as a number of shunt inductors increases, the Q value increases.

17. The wireless power transmission method of claim 14, wherein the resonance circuit further comprises a series inductor and a shunt capacitor.

18. The wireless power transmission method of claim 14, wherein the slot in the substrate lengthens a path of the current flow.

* * * * *